(12) United States Patent
Chiba

(10) Patent No.: US 9,840,757 B2
(45) Date of Patent: Dec. 12, 2017

(54) ROLLED COPPER FOIL FOR PRODUCING TWO-DIMENSIONAL HEXAGONAL LATTICE COMPOUND AND METHOD OF PRODUCING TWO-DIMENSIONAL HEXAGONAL LATTICE COMPOUND

(71) Applicant: JX Nippon Mining & Metals Corporation, Tokyo (JP)

(72) Inventor: Yoshihiro Chiba, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 138 days.

(21) Appl. No.: 14/738,076

(22) Filed: Jun. 12, 2015

(65) Prior Publication Data

US 2015/0361584 A1 Dec. 17, 2015

(30) Foreign Application Priority Data

Jun. 13, 2014 (JP) ................................. 2014-122097

(51) Int. Cl.
  *C30B 29/02* (2006.01)
  *C22C 9/00* (2006.01)
  (Continued)

(52) U.S. Cl.
  CPC ................ *C22C 9/00* (2013.01); *B32B 15/01* (2013.01); *C22F 1/08* (2013.01); *C30B 25/18* (2013.01);
  (Continued)

(58) Field of Classification Search
  CPC .... C30B 1/00; C30B 1/02; C30B 1/04; C30B 1/06; C30B 25/00; C30B 25/02;
  (Continued)

(56) References Cited

U.S. PATENT DOCUMENTS 5,800,905 A 9/1998 Sheridan et al.
7,479,590 B1 1/2009 Kuczynski
(Continued)

FOREIGN PATENT DOCUMENTS

EP 2 664 580 11/2013
JP 2000-256765 9/2000
(Continued)

OTHER PUBLICATIONS

Alfa Aesar, copper foil product information available online at http://www.alfa.com/ja/GP140W.pgm?task=product&srchtyp=ELEM&PSvalue=Copperfoil&element=Cu&group=988.0000 , downloaded Dec. 12, 2012.
(Continued)

*Primary Examiner* — Kenneth A Bratland, Jr.
(74) *Attorney, Agent, or Firm* — Jenkins, Wilson, Taylor & Hunt

(57) ABSTRACT

A rolled copper foil for producing a two-dimensional hexagonal lattice compound, including P: 0.01 to 0.21 wt %, Fe: 0.006 wt % or less, and the balance being Cu and inevitable impurities, and having the following relationship: $2.0 <= (I/I_0)$ where I is a (111) diffraction intensity determined by an X ray diffraction of a rolled surface after heating at 1000° C. for 30 minutes and $I_0$ is a (111) diffraction intensity determined by an X ray diffraction of fine powder copper.

16 Claims, 3 Drawing Sheets

(51) Int. Cl.
  *C30B 25/18* (2006.01)
  *B32B 15/01* (2006.01)
  *C22F 1/08* (2006.01)

(52) U.S. Cl.
  CPC ....... *C30B 29/02* (2013.01); *Y10T 428/12431* (2015.01)

(58) Field of Classification Search
  CPC ....... C30B 25/18; C30B 25/186; C30B 28/00; C30B 29/00; C30B 29/02; C30B 29/04; C30B 33/00; C30B 33/02; C22C 9/00; B32B 15/01; C22F 1/08; Y10T 428/12431
  USPC ......... 117/4, 7, 9–10, 84, 87–88, 94, 97–98, 117/101, 104, 106–107, 902, 913–915, 117/922, 928–929
  See application file for complete search history.

(56) References Cited

U.S. PATENT DOCUMENTS

| | | | |
|---|---|---|---|
| 9,255,007 B2 | 2/2016 | Chiba et al. | |
| 9,260,310 B2 | 2/2016 | Chiba | |
| 9,359,212 B2 | 6/2016 | Chiba et al. | |
| 9,487,404 B2 | 11/2016 | Chiba et al. | |
| 2001/0008091 A1 | 7/2001 | Takahashi et al. | |
| 2002/0108422 A1 | 8/2002 | Sugikawa | |
| 2004/0110015 A1 | 6/2004 | Narui et al. | |
| 2009/0010797 A1* | 1/2009 | Aruga | C22C 9/00 420/472 |
| 2009/0047539 A1 | 2/2009 | Dobashi et al. | |
| 2009/0155561 A1 | 6/2009 | Choi et al. | |
| 2010/0038115 A1 | 2/2010 | Matsuda et al. | |
| 2010/0255970 A1 | 10/2010 | Kogetsu et al. | |
| 2011/0070146 A1 | 3/2011 | Song et al. | |
| 2011/0123389 A1 | 5/2011 | Shindo et al. | |
| 2011/0195207 A1 | 8/2011 | Hong et al. | |
| 2011/0201739 A1 | 8/2011 | Beall | |
| 2012/0039344 A1* | 2/2012 | Kian | H01S 3/1118 372/6 |
| 2012/0132516 A1 | 5/2012 | Zimmerman | |
| 2014/0183160 A1 | 7/2014 | Chiba et al. | |
| 2014/0196841 A1 | 7/2014 | Chiba et al. | |
| 2014/0216650 A1 | 8/2014 | Chiba | |
| 2014/0246399 A1 | 9/2014 | Chiba | |
| 2014/0353278 A1 | 12/2014 | Chiba et al. | |
| 2015/0232342 A1 | 8/2015 | Chiba | |

FOREIGN PATENT DOCUMENTS

| | | |
|---|---|---|
| JP | 2000-328158 | * 11/2000 |
| JP | 2002-120050 | 4/2002 |
| JP | 2004-074214 | 3/2004 |
| JP | 2004-284938 | 10/2004 |
| JP | 2006-281249 | 10/2006 |
| JP | 2006-326684 | 12/2006 |
| JP | 2009-143799 | 7/2009 |
| JP | 2009-215146 | 9/2009 |
| JP | 2010-227971 | 10/2010 |
| JP | 2011-051801 | 3/2011 |
| JP | 2011-063506 | 3/2011 |
| JP | 2011-070830 | 4/2011 |
| JP | 2011-136357 | 7/2011 |
| JP | 2011-162877 | 8/2011 |
| JP | 2012-006824 | 1/2012 |
| JP | 2012-201926 | 10/2012 |
| JP | 2013-107036 | 6/2013 |
| JP | 5298225 | 9/2013 |
| JP | 5721609 | 5/2015 |
| WO | WO 2011/081044 | 7/2011 |
| WO | WO 2012/111840 | 8/2012 |
| WO | WO 2012/165051 | 12/2012 |
| WO | WO 2012/165548 | 12/2012 |
| WO | WO 2013/047053 | 4/2013 |
| WO | WO 2013/065601 | 5/2013 |
| WO | WO 2013/073367 | 5/2013 |
| WO | WO 2013/168646 | 11/2013 |
| WO | WO 2014/027528 | 2/2014 |

OTHER PUBLICATIONS

European Search Report corresponding to European Application No. 12747854.3-1362 dated Oct. 6, 2014.
European Search Report corresponding to Eurpean Application No. 12845162.2-1362 dated Jan. 7, 2015.
European Search Report corresponding to European Application No. 12793061.8-1355 dated May 12, 2015.
European Search Report corresponding to European Application No. 12793262.2-1355 dated May 12, 2015.
Gao et al., "Efficient Growth of High-Quality Graphene Films on Cu Foils by Ambient Pressure Chemical Vapor Deposition," Applied Physics Letters, vol. 97, No. 18, pp. 183109-1-183109-3 (Nov. 1, 2010).
International Search Report corresponding to International Patent Application No. PCT/JP2012/053945 dated May 29, 2012.
International Search Report corresponding to International Patent Application No. PCT/JP2012/059652 dated May 17, 2012.
International Search Report corresponding to International Patent Application No. PCT/JP2012/064077 dated Aug. 23, 2012.
International Search Report corresponding to International Patent Application No. PCT/JP2012/077745 dated Dec. 11, 2012.
International Search Report corresponding to International Patent Application No. PCT/JP2012/078124 dated Nov. 27, 2012.
International Search Report corresponding to International Patent Application No. PCT/JP2013/068636 dated Aug. 27, 2013.
Li et al., "Large-Area Synthesis of High-Quality and Uniform Graphene Films on Copper Foils," Science. vol. 324, No. 5932 pp. 1312-1314 (2009).
Luo et al., "Effect of Substrate Roughness and Feedstock Concentration on Growth of Water-Scale Graphene at Atmospheric Pressure," Chemistry of Materials. vol. 23, No. 6 pp. 1441-1447 (2011).
Luo et al., "Large Scale Synthesis of Bi-Layer Graphene in Strongly Coupled Stacking Order," Condensed Matter, 1-20 (Dec. 3, 2010); URL:http://aps.arxiv.org/ftp/arxiv/papers/1012/1012.0701.pdf
Machine Translation, Nakamura, JP 2010-227971, Oct. 2010.
Notification of Transmittal of Translation of the International Preliminary Report on Patentability (Chapter I or Chapter II of the Patent Cooperation Treaty) corresponding to International Patent Application No. PCT/JP2012/053945 dated Aug. 22, 2013.
Notification of Transmittal of Translation of the International Preliminary Report on Patentability (Chapter I or Chapter II of the Patent Cooperation Treaty) corresponding to International Patent Application No. PCT/JP2012/059652 dated Dec. 2, 2013.
Notification of Transmittal of Translation of the International Preliminary Report on Patentability (Chapter I or Chapter II of the Patent Cooperation Treaty) corresponding to International Patent Application No. PCT/JP2012/064077 dated Dec. 2, 2013.
Notification of Transmittal of Translation of the International Preliminary Report on Patentability (Chapter I or Chapter II of the Patent Cooperation Treaty) corresponding to International Patent Application No. PCT/JP2012/077745 dated May 8, 2014.
Notification of Transmittal of Translation of the International Preliminary Report on Patentability (Chapter I or Chapter II of the Patent Cooperation Treaty) corresponding to International Patent Application No. PCT/JP2012/078124 dated May 15, 2014.
Notification of Transmittal of Translation of the International Preliminary Report on Patentability (Chapter I or Chapter II of the Patent Cooperation Treaty) corresponding to International Patent Application No. PCT/JP2013/068636 dated Feb. 26, 2015.
Official Action corresponding to U.S. Appl. No. 14/122,930 dated Feb. 20, 2015.
Official Action corresponding to U.S. Appl. No. 13/985,931 dated May 8, 2015.
Official Action corresponding to U.S. Appl. No. 14/355,348 dated Jun. 4, 2015.

(56) References Cited

OTHER PUBLICATIONS

Official Action corresponding to U.S. Appl. No. 14/356,142 dated Jun. 8, 2015.
Official Action corresponding to U.S. Appl. No. 14/122,930 dated Jun. 18, 2015.
Restriction Requirement corresponding to U.S. Appl. No. 14/122,930 dated Dec. 3,.
Restriction Requirement corresponding to U.S. Appl. No. 14/355,348 dated Feb. 26, 2015.
Restriction Requirement correponding to U.S. Appl. No. 14/356,142 dated Mar. 12, 2015.
Smoukov et al., "Freestanding Three-Dimensional Copper Foils Prepared by Electroless Deposition on Micropatterned Gels," Advanced Materials, vol. 17, No. 6 pp. 751-755 (2005).
Sukang Bae et al., "Roll-to-ro ll production of 30-inch graphene films for transparent electrodes," Nature Nanotechnology, vol. 5, No. 8 pp. 574-578 (2010).
Written Opinion corresponding to International Patent Application No. PCT/JP2012/053945 dated Aug. 18, 2013.
Written Opinion corresponding to International Patent Application No. PCT/JP2012/077745 dated Dec. 11, 2012.
Written Opinion corresponding to International Patent Application No. PCT/JP2012/078124 dated Nov. 15, 2012.
Wofford et al., "Graphene Islands on Cu Foils: The Interplay between Shape, Orientation, and Defects," Nano Letters, vol. 10, pp. 4890-4896 (Oct. 27, 2010).
Advisory Action corresponding to U.S. Appl. No. 14/355,348 dated Feb. 23, 2016.
English translation, Nakamura, JP 2010-227971, from Japan Platform for Patent Information, Aug. 6, 2015.
European Search Report corresponding to European Application No. 12850534.4-1362 dated Nov. 3, 2015.
Interview Summary corresponding to U.S. Appl. No. 14/355,348 dated Jan. 21, 2016.
Interview Summary corresponding to U.S. Appl. No. 14/356,142 dated Feb. 1, 2016.
Notice of Allowance corresponding to U.S. Appl. No. 14/122,930 dated Oct. 7, 2015.
Notice of Allowance corresponding to U.S. Appl. No. 13/985,931 dated Oct. 23, 2015.
Notice of Allowance corresponding to U.S. Appl. No. 14/356,142 dated Oct. 27, 2015.
Notice of Allowance corresponding to U.S. Appl. No. 14/356,142 dated Feb. 1, 2016.
Notice of Allowance corresponding to U.S. Appl. No. 14/122,942 dated Jul. 8, 2016.
Official Action corresponding to European Patent Application No. 12850534.4-1362 dated Dec. 8, 2015.
Official Action corresonding to U.S. Appl. No. 14/355,348 dated Nov. 3, 2015.
Official Action corresponding to U.S. Appl. No. 14/122,942 dated Feb. 11, 2016.
Official Action corresponding to U.S. Appl. No. 14/355,348 dated May 10, 2016.
Restriction Requirement corresponding to U.S. Appl. No. 14/122,942 dated Sep. 30, 2015.
Japanese Industrial Standard. JIS-H3100 (1992).
Japanese Industrial Standard. JIS-H3250 (1992).
Japanese Industrial Standard. JIS-H3510 (1986).
Japanese Industrial Standard. JIS Z2241 (1993).
Japanese Industrial Standard. JIS Z8741 (1997).

\* cited by examiner (a)  (b)

ROLLED COPPER FOIL FOR PRODUCING TWO-DIMENSIONAL HEXAGONAL LATTICE COMPOUND AND METHOD OF PRODUCING TWO-DIMENSIONAL HEXAGONAL LATTICE COMPOUND

CROSS-REFERENCE TO RELATED APPLICATIONS

The present U.S. patent application claims priority to Japanese Patent Application No. 2014-122097, filed Jun. 13, 2014, the disclosure of which is incorporated herein by reference in its entirety.

FIELD OF THE INVENTION

The present invention relates to a copper foil for producing a two-dimensional hexagonal lattice compound such as graphene and boron nitride, and a method of producing a two-dimensional hexagonal lattice compound.

DESCRIPTION OF THE RELATED ART

Graphite has a layered structure where a plurality of layers of carbon six-membered rings planarly arranged is laminated. The graphite having a mono atomic layer or around several atomic layers is called as graphene or a graphene sheet. The graphene sheet has own electrical, optical and mechanical properties, and in particularly has a high carrier mobility speed. Therefore, the graphene sheet has expected to be applied in various industries as a fuel cell separator, a transparent electrode, a conductive thin film for a display device, a "mercury-free" fluorescent lamp, a composite material, a carrier for Drug Delivery System (DDS) etc.

As a method of producing the graphene sheet, it is known that graphite is peeled with an adhesion tape. However, there are problems in that the number of the layer(s) of the graphene sheet obtained is not uniform, a wide area graphene sheet is difficult to be provided, and it is not suitable for mass production.

A technology has been developed that a sheet-like monocrystal graphitized metal catalyst is contacted with a carboneous substance and then is heat treated to grow the graphene sheet (Chemical Vapor Deposition (CVD) method) (Patent Literature 1). As the monocrystal graphitized metal catalyst, there is described a metal substrate made of Ni, Cu or W, for example.

Similarly, a technology has been reported that a graphene film is formed by the chemical vapor deposition method on a copper layer formed on an Ni or Cu metal foil or an Si substrate. The graphene film is formed at about 1000° C. (Non-Patent Literature 1).

If a copper foil is heated to form a graphene film (about 1000° C.), graphene is grown on a recrystallized surface. It is known that a mismatch between an atomic arrangement of a (111) plane of the copper foil and a sp2 bonded carbon atom arrangement corresponding to a carbon bond of graphene is small. Therefore, it is expected that graphene is advantageously synthesized if a copper foil is highly crystal oriented in the (111) plane. However, a general rolled copper foil is highly crystal oriented in a random orientation or a (001) orientation (Cube orientation). Therefore, a lattice constant of copper foil crystal is greatly different from a lattice constant of graphene upon graphene film formation. As a result, an mismatched graphene film may be synthesized to generate undesirable defects.

Here, the lattice constant of the copper foil in the (001) orientation is 0.361 nm, and the lattice constant of the copper foil in the (111) orientation is 0.255 nm. In contrast, the lattice constant of graphene is 0.142 nm. However, a side length of a triangle formed in a hexagonal graphene domain is 0.246 nm, which is close to the lattice constant of the copper foil in the (111) orientation, thereby forming matched graphene. In other words, by increasing a percentage of the (111) orientation, the defects of graphene are inhibited, and a production yield is improved. A lattice constant of boron nitride is 6.66 nm, and a boron nitride film formed on the (111) plane of the copper foil is highly matched.

The present applicant has developed a copper foil where a percentage of the (111) plane on the surface is 60% or more by forming a Cu plating layer or a Cu sputtering layer on the surface of the copper foil (Patent Literature 2).

PRIOR ART LITERATURE

Patent Literature

[Patent Literature 1] Japanese Unexamined Patent Publication (Kokai) 2009-143799
[Patent Literature 2] Japanese Unexamined Patent Publication (Kokai) 2013-107036

Non-Patent Literature

[Non-Patent Literature 1] SCIENCE Vol. 324 (2009) P1312-1314

SUMMARY OF INVENTION

Problems to be Solved by the Invention

However, it is not easy and spends high costs to produce the monocrystal metal substrate, a wide area substrate is difficult to be provided, and a wide area graphene sheet is thus difficult to be provided, as described in Patent Document 1. On the other hand, Non-Patent Document 1 describes that Cu is used as the substrate. Graphene is not grown on a copper foil in a plane direction within a short time. A Cu layer formed on an Si substrate is annealed to provide coarse grains, thereby providing a substrate. In this case, a size of graphene is limited to the size of the Si substrate, and its production costs are high, too.

Here, the reason for superiority of the copper as the catalyst of graphene growth is that the copper little dissolves carbon. When the copper acts as the catalyst, carbon atoms produced by thermal decomposition of a hydrocarbon gas form graphene on the surface of the copper. Once the copper is covered with graphene, the copper no longer acts as the catalyst. The hydrocarbon gas will not be further thermally decomposed, and a plurality of graphene layers is unlikely formed. Instead, a graphene monolayer is provided. In this regard, a copper monocrystal is good as a substrate for producing graphene. However, as the copper monocrystal is expensive and has a limited size, it is not suitable to form a large area graphene film.

In the case of the technology descried in Patent Literature 2, there is a room for productivity improvement in that the step for forming the Cu plating layer or the Cu sputtering layer is necessary.

In other words, an object of the present invention is to provide a rolled copper foil for producing a two-dimensional hexagonal lattice compound such as graphene and boron nitride, and a method of producing a two-dimensional hexagonal lattice compound using the same with low costs and high quality.

Means for Solving the Problems

The present invention provides a rolled copper foil for producing a two-dimensional hexagonal lattice compound, including P: 0.01 to 0.21 wt %, Fe: 0.006 wt % or less, and the balance being Cu and inevitable impurities, and having the following relationship: $2.0<=(I/I_0)$ where I is a (111) diffraction intensity determined by an X ray diffraction of a rolled surface after heating at 1000° C. for 30 minutes and $I_0$ is a (111) diffraction intensity determined by an X ray diffraction of fine powder copper.

Preferably, the average crystal grain size is 1000 μm or more after heating at 1000° C. for 30 minutes measured with a cutting method by JIS H0501.

Preferably, when 0.015 mm² of a section area is observed, 1 to 60 inclusions each having a 0.1 μm or more of a circle conversion diameter are present.

Preferably, a thickness is 5 to 50 μm.

Preferably, the two-dimensional hexagonal lattice compound is one of graphene and boron nitride.

Preferably, the rolled copper foil for producing a two-dimensional hexagonal lattice compound further comprises 0.01 wt % or less in total of one or more of elements selected from the group consisting of Ni, Sn, Mg, Ti and Zr.

Preferably, the rolled copper foil for producing a two-dimensional hexagonal lattice compound of the present invention is produced by hot rolling an ingot, annealing and cold rolling repeatedly one time or more, recrystallization annealing, and finally cold rolling, wherein reduction ratio η in the final cold rolling is defined as $1.0<=η<4.5$.

Also, the present invention provides a method of producing a two-dimensional hexagonal lattice compound using the rolled copper foil for producing a two-dimensional hexagonal lattice compound, comprising the steps of: providing a raw material gas of the two-dimensional hexagonal lattice compound while placing the heated rolled copper foil for producing a two-dimensional hexagonal lattice compound in a predetermined chamber to form the two-dimensional hexagonal lattice compound on a surface of the rolled copper foil for producing a two-dimensional hexagonal lattice compound; laminating a transfer sheet on the surface of the two-dimensional hexagonal lattice compound, and etching and removing the rolled copper foil for producing a two-dimensional hexagonal lattice compound while transferring the two-dimensional hexagonal lattice compound to the transfer sheet.

Effect of the Invention

According to the present invention, there can be provided a rolled copper foil being capable of producing a two-dimensional hexagonal lattice compound such as graphene and boron nitride with low costs and high quality.

DESCRIPTION OF THE EMBODIMENTS

Figure 1:
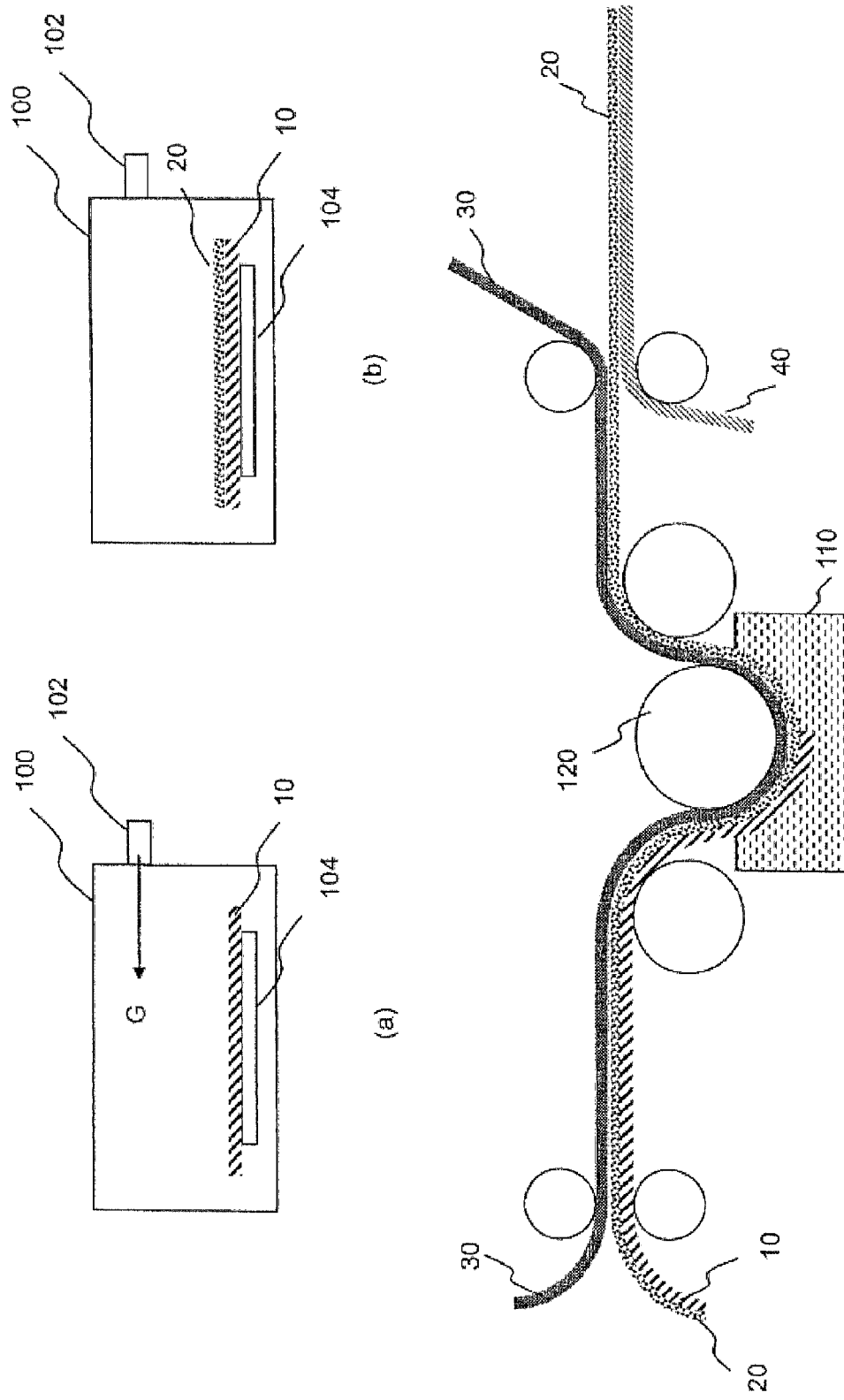
FIG. 1 A process chart showing a method of producing graphene according to an embodiment of the present invention.

Hereinafter, a rolled copper foil for producing a two-dimensional hexagonal lattice compound and a method of producing a two-dimensional hexagonal lattice compound according to an embodiment of the present invention will be described. The symbol "%" herein refers to % by weight, unless otherwise specified. The rolled copper foil for producing two-dimensional hexagonal lattice compound according to an embodiment of the present invention is just rolled without forming a coating such as a Cu plating layer and a Cu sputtering layer on a surface of a copper foil after rolling (except that a heat treatment after rolling may be performed).

In the following description, graphene is intended as an example of the two-dimensional hexagonal lattice compound. However, the two-dimensional hexagonal lattice compound used in the present invention is not limited to graphene, and may be boron nitride or molybdenum disulfide. The two-dimensional hexagonal lattice compound has a crystal structure where atoms are bonded in a hexagonal lattice extending two-dimensionally at a thickness of an atomic layer.

The present inventor has been found that if P and Fe contents are specified in the composition of the rolled copper foil, a percentage of a (111) orientation close to a lattice constant of graphene can be increased, and defects of graphene caused by mismatch between lattice constants of copper foil crystal and graphene upon cooling can be inhibited.

In other words, the rolled copper foil for producing the two-dimensional hexagonal lattice compound according to the embodiment of the present invention includes P: 0.01 to 0.21 wt %, Fe: 0.006 wt % or less, and the balance being Cu and inevitable impurities, and has the following relationship: $2.0<=(I/I_0)$ where I is a (111) diffraction intensity determined by an X ray diffraction of a rolled surface after heating at 1000° C. for 30 minutes, and $I_0$ is a (111) diffraction intensity determined by an X ray diffraction of fine powder copper.

<Composition of Copper Foil>

If the P content in the rolled copper foil is less than 0.01 wt %, the percentage of the (111) orientation cannot be increased, and the $(I/I_0)$ is less than 2.0. On the other hand, if the P content in the rolled copper foil exceeds 0.21 wt %, a FeP compound is formed with Fe and is segregated, resulting in a difficulty in the production of the copper foil.

If the Fe content in the rolled copper foil exceeds 0.006 wt %, a FeP compound is formed with Fe and is segregated, resulting in a difficulty in the production of the copper foil. The lower the Fe content in the rolled copper foil is, the better it is. In view of the production costs, a lower limit of the Fe content may be about 0.002 wt %, for example.

The rolled copper foil according to the present invention may further includes 0.01 wt % or less in total of one or more of elements selected from the group consisting of Ni, Sn, Mg, Ti and Zr. If the above-described element is included, the rolled copper foil has an improved strength, has an adequate elongation, and has a great crystal grain size. If a content percentage of the above-described element(s) exceeds 0.01 wt %, the strength is further increased, but the elongation may be decreased, a workability may be lowered, and a growth of a crystal grain size may be inhibited.

Although a lower limit of the content percentage of the above-described element(s) is not especially limited, the lower limit may be 0.005% by weight, for example. If the content percentage of the above-described element(s) is less than 0.005% by weight, the content percentage is low and may be difficult to be controlled.

The rolled copper foil for producing a two-dimensional hexagonal lattice compound according to the present invention can be produced by adding the above-described content percentage of P to pure copper, tough pitch copper (TPC) in accordance with JIS-H3100 or oxygen free copper (OFC) in accordance with JIS-H3100.

If the ($I/I_0$) of the rolled copper foil is 2.0 or more, the percentage of the (111) orientation close to the lattice constant of graphene or boron nitride can be increased, and the defects of graphene caused by mismatch between lattice constants of copper foil crystal and graphene upon cooling can be inhibited. The rolled copper foil is especially suitable for producing large-area graphene used in a display.

If the ($I/I_0$) is <2.0, the percentage of the (111) orientation is decreased, and a lattice constant of the copper foil and a lattice constant of graphene or boron nitride become mismatched to significantly generate defects of graphene.

Although an upper limit of the ($I/I_0$) is not especially limited, it is about 65 from a practical standpoint.

The (111) diffraction intensity (I) is specified after heating at 1000° C. for 30 minutes in order to simulate a temperature condition when graphene is grown on the copper foil. A heating atmosphere may be air. The (111) diffraction intensity ($I_0$) of the copper foil is measured after heating under the above-described conditions and allowing to cool to normal temperature (25° C.). On the other hand, the (111) diffraction intensity ($I_0$) of the fine powder copper is measured at normal temperature (25° C.) without heating.

Before heating at 1000° C. for 30 minutes, the ($I/I_0$) of the rolled copper foil is less than 2.0. By the heating, it is recrystallized to grow the (111) orientation. At this time, I and $I_0$ are integrated intensities. Using a basic data processing software of an XRD measurement apparatus (RINT2000), a background is processed. The background is deleted using a "straight line in contact with to both ends" method of the software, which is measured ±2.5 degree from a peak.

<Average Crystal Grain Size>

After a rolled copper foil according to the present invention is heated at 1000° C. for 30 minutes, an average crystal grain size thereof is preferably 1000 μm or more measured with a cutting method by JIS H0501. When P is contained in the rolled copper foil, the rolled copper foil is recrystallized, thereby growing the (111) orientation, when it is heated to a film-forming condition for graphene and so on (about 1000° C.). The crystal grains in the (111) orientation tend to have an average grain size of 1000 μm or more. Accordingly, if the average crystal grain size of the rolled copper foil is 1000 μm or more, the (111) orientation sufficiently grows such that the ($I/I_0$) is 2.0 or more.

Note that the average crystal grain size is determined by heating a sample at 1000° C. for 30 minutes for the first time. In other words, it does not mean that the sample where the (111) diffraction intensity (I) is already measured by heating at 1000° C. for 30 minutes is further heated at 1000° C. for 30 minutes.

Before heating at 1000° C. for 30 minutes, the average crystal grain size of the rolled copper foil is less than 1000 μm, and it is recrystallized by heating to grow crystals.

An upper limit of the average crystal grain size is not especially limited, but is about 3000 μm, for example.

<Inclusion>

When a 0.003 mm$^2$ of section area of the rolled copper foil is observed, 1 to 60 inclusions each having a 0.1 μm or more of a circle conversion diameter are preferably present. It appears that the inclusion having a 0.1 μm or more of a circle conversion diameter contains P. It is assumed that the inclusion containing P provides a pinning effect in the (111) orientation when the rolled copper foil is recrystallized at a film-forming temperature of graphene. The higher the number of the inclusions are, the more the (111) orientation is.

However, if the number of the inclusions exceeds 60, defects such as cracks and holes caused by the inclusions are generated upon hot rolling resulting in a difficulty in a production of the copper foil. If the number of the inclusions is less than 1, the pinning effect is not exercised and the rolled copper foil is little oriented in the (111) orientation.

The section of the rolled copper foil is processed by FIB (focused ion beam) using FIB-SEM (scanning electron microscope). A specific section processed by FIB is observed by SEM to measure the number of the inclusions.

The number of the inclusions each having 0.1 μm or more of a circle conversion diameter is counted using image analysis software.

<Thickness>

The thickness of the rolled copper foil for producing a two-dimensional hexagonal lattice compound of the present invention is not especially limited, but is generally 5 to 50 μm. Preferably, the thickness of the copper foil is 12 to 50 μm for ease of etching and removal as described later while assuring handleability. If the thickness is less than 12 μm, it may be easily broken and have less handleability. If the thickness exceeds 50 μm, etching and removal may be difficult.

<Production of Rolled Copper Foil>

The rolled copper foil according to the embodiment of the present invention can be produced as follows, for example: Firstly, a copper ingot having a predetermined composition is produced, is hot rolled, and is annealed and cold rolled repeatedly one time or more to provide a rolled sheet. The rolled sheet is recrystallization annealed, and finally cold rolled to a predetermined thickness of a rolling reduction of 80 to 99.9% (preferably 85 to 99.9%, more preferably 90 to 99.9%), thereby providing a copper foil.

Here, if reduction ratio η in the final cold rolling is defined as $1.0 \leq \eta < 4.5$, the rolled copper foil having $2.0 \leq (I/I_0)$ can be stably produced. In general, if pure copper is recrystallized after sever working, it tends to grow the (001) orientation. If the reduction ratio η is less than 4.5, it appears that the (001) orientation is inhibited from growing and the (111) orientation is grown. Accordingly, if the reduction ratio exceeds 4.5, $2.0 > (I/I_0)$.

On the other hand, if the reduction ratio η is less than 1.0, the reduction ratio becomes too small, a stress is insufficient as a driving force of recrystallization, and non-recrystallized grains are generated. Therefore, the (111) orientation is insufficient and it results in $2.0 > (I/I_0)$.

The reduction ratio η is represented by $\eta = \ln(A0/A1)$, where A0 is a section area before the final cold rolling (i.e., after recrystallization annealing), and A1 is a section area after the final cold rolling.

<Method of Producing Two-dimensional Hexagonal Lattice Compound>

Next, referring to FIG. 1, a method of producing graphene according to the embodiment of the present invention will be described.

First, the above-described copper foil 10 for producing graphene of the present invention is placed in a chamber (such as a vacuum chamber) 100 and is heated by a heater 104. At the same time, the pressure in the chamber 100 is reduced or the chamber 100 is vacuum-evacuated. Then, a carbon-containing gas G is fed to the chamber 100 together with a hydrogen gas through a gas supply inlet 102 (FIG. 1(a)). The carbon-containing gas G is a raw material gas, and the hydrogen gas is necessary to decompose the carbon-containing gas G. As the carbon-containing gas G, carbon dioxide, carbon monoxide, methane, ethane, propane, ethylene, acetylene, alcohol or the like is cited, but is not limited thereto. One or more of these gases may be mixed. The copper foil 10 for producing graphene may be heated at a decomposition temperature of the carbon-containing gas G or more. For example, the temperature can be 1000° C. or more. Alternatively, the carbon-containing gas G may be heated at the decomposition temperature or more within the chamber 100, and the decomposed gas may bring into contact with the copper foil 10 for producing graphene. Then, the surface of the copper foil 10 for producing graphene is contacted with a decomposition gas (a carbon gas) to form the graphene 20 on the surface of the copper foil 10 for producing graphene (see FIG. 1(b)).

Then, the copper foil 10 for producing graphene is cooled to normal temperature, a transfer sheet 30 is laminated on the surface of the graphene 20, and the graphene 20 is transferred to the transfer sheet 30. Next, the laminate is continuously immersed into an etching tank 110 via a sink roll 120, and the copper foil 10 for producing graphene is removed by etching (FIG. 1(c)). In this way, the graphene 20 laminated on the predetermined transfer sheet 30 can be produced.

In addition, the laminate from which the copper foil 10 for producing graphene is removed is pulled up, and a substrate 40 is laminated on the graphene 20. While the graphene 20 is transferred to the substrate 40, the transfer sheet 30 is removed, whereby the graphene 20 laminated on the substrate 40 can be produced.

As the transfer sheet 30, a variety of resin sheets (a polymer sheet such as polyethylene, polyurethane etc.) can be used. As an etching reagent for etching and removing the copper foil 10 for producing graphene, a sulfuric acid solution, a sodium persulfate solution, a hydrogen peroxide and sodium persulfate solution, or a solution where sulfuric acid is added to hydrogen peroxide can be, for example, used. As the substrate 40, an Si, SiC, Ni or Ni alloy can be, for example, used.

If boron nitride is produced in place of graphene, a raw material gas, e.g., borazine ($B_3N_3H_6$) is used. In the case of boron nitride, the raw material gas should be feed together with hydrogen gas.

If molybdenum disulfide is produced, a raw material gas, e.g., $(NH_4)_2MoS_2$ is used. In the case of molybdenum disulfide, the raw material gas should be feed together with hydrogen gas and nitrogen gas.

EXAMPLE

<Preparation of Sample>

A cooper ingot having a composition shown in Table 1 was prepared, was hot rolled at 850 to 950° C., and was annealed in a continuous annealing line at 300 to 800° C. and cold rolled, which was repeated one time, to provide a rolled sheet having a thickness of 1 to 4 mm. The rolled sheet was annealed and re-crystallized in the continuous annealing line at 400 to 900° C., and was finally cold rolled to the thickness shown in Table 1 at the reduction ratio of η shown in Table 1 to provide each copper foil in respective Examples and Comparative Examples. At this time, the minor components were Ni: 0.0002 wt %, Sn: 0.0002 wt %, Mg: 0.0001 wt %, Ti: 0.0001 wt % and Zr: 0.0001 wt %. The total with other minor components was 0.01 wt % or less. The resultant copper foil was evaluated as follows:

($I/I_0$)

The resultant copper foil was heated at 1000° C. for 30 minutes under argon atmosphere and was cooled to room temperature to determine a (111) diffraction intensity (an integrated value of a (111) plane intensity) (I) by an X ray diffraction of a rolled surface. The (111) diffraction intensity (I) was divided by the (111) diffraction intensity ($I_0$) of fine powder copper (3 g of powder having a purity of 99.5% and 325 mesh was compressed to a diameter of 20 mm and thickness of 1.35 mm, and was heated at 300° C. for 1 hour in a hydrogen stream before use) that was measured at 25° C. in advance to calculate ($I/I_0$). The X ray diffraction was measured using a Cu tube at a voltage of 25 kV and a current of 20 mA.

<Measurement of Average Crystal Grain Size>

The resultant copper foil was heated at 1000° C. for 30 minutes under argon atmosphere, and was cooled to room temperature. For a rolled surface, an SEM image was acquired by using an SEM apparatus attached to an EBSD (electron backscatter diffraction apparatus, JXA8500F manufactured by JEOL Ltd., an accelerating voltage of 20 kV, a current of 2e-8 A, a measurement range of 1700 μm×2690 μm, a step width of 10 μm). An average crystal grain size was measured in the SEM image in accordance with a cutting method by JIS H0501.

Note that if the average crystal grain size exceeded 1000 μm, it was recorded as 1000 μm or more.

(Inclusion)

The resultant copper foil was heated at 1000° C. for 30 minutes under argon atmosphere, and was cooled to room temperature. Using FIB (focused ion beam processing observation apparatus)—SEM (scanning electron microscope), a cross-section of the copper foil was processed by FIB. The cross-section having an area of 0.003 mm² was observed by SEM to measure the number of inclusions. The number of the inclusions each having a 0.1 μm or more of a circle conversion diameter was counted using an image analysis software (a two-dimensional image analysis software manufactured by NIPPON ROPER K.K under a trade name of Image-Pro PLUS).

The measured area of the inclusions was 0.003 mm² in a width direction of 0.1 mm x a thickness direction of 0.03 mm of the cross-section of the rolled copper foil. The measurement was made in a constant area. If the rolled copper foil had a thickness of less than 0.03 mm, the length of the width direction was adjusted to exceed 0.1 mm for the constant area.

<Tensile Strength (TS), Elongation (EL)>

A tensile test was conducted at a gauge length of 50 mm and a tensile speed of 5 mm/min. An average value at N=5 was taken as tensile strength and elongation (total elongation at breaking). Using a tensile tester, the copper foil was tensile tested in a direction in parallel with the rolling direction in accordance with JIS-Z2241.

<Production of Graphene>

The copper foil (horizontal and vertical 100×100 mm) in each Example and Comparative Example was placed in a vacuum chamber, and heated at 1000° C. Under vacuum (pressure: 0.2 Torr), methane gas and hydrogen gas were fed into the vacuum chamber (fed gas flow rate: 10 to 100 cc/min), the copper foil was heated to 1000° C. for 30 minutes and held for 1 hour to grow graphene on the surface of the copper foil.

A PET film was adhered to the copper foil at a graphene side where graphene was grown on the surface, and the copper foil was etched and removed by acid. Thereafter, a sheet resistance of graphene was measured by a four probe method.

When the sheet resistance of graphene is 400 Ω/square or less, there is no practical problem.

Table 1 shows the obtained result. In Table 1, "TPC" represents tough pitch copper in accordance with JIS-H3100, and "OFC" represents oxygen free copper in accordance with JIS-H3100.

Figure 2:
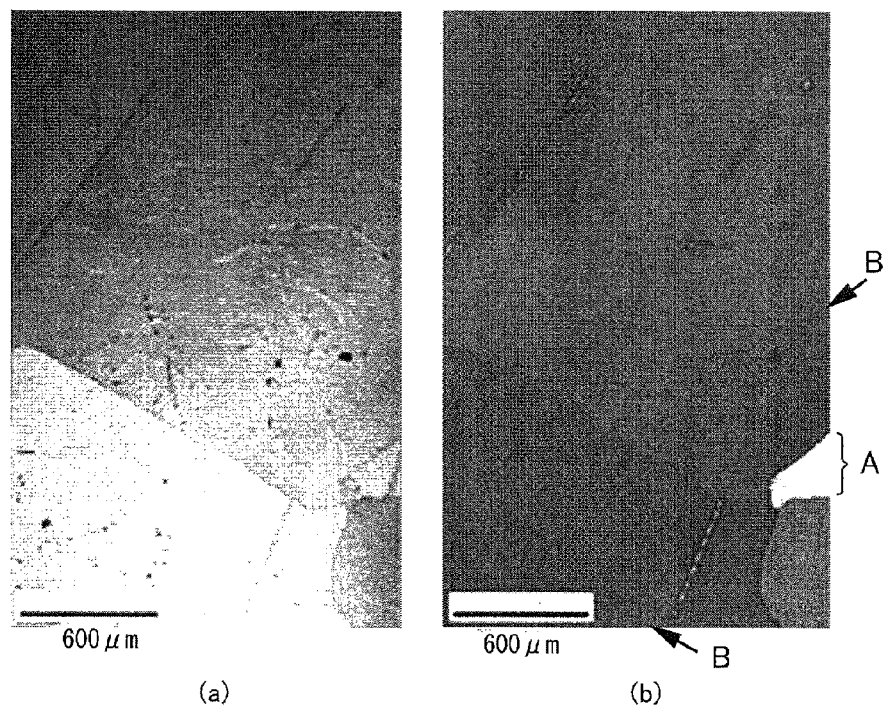
FIG. 2 An EBSD image of a rolled surface of a copper foil heated at 1000° C. for 30 minutes in Example 6.
Figure 2:
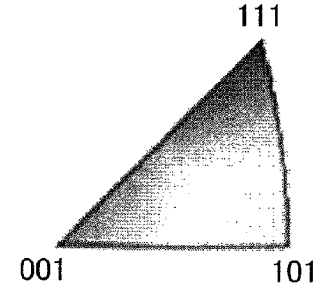

EBSD apparatus, and FIG. 2 (b) is an EBSD image. A dark section B in FIG. 2 (b) shows a (111) orientation and a bright section A shows a (101) orientation. In Example 6, it shows that the (111) orientation occupies the majority.

Figure 3:
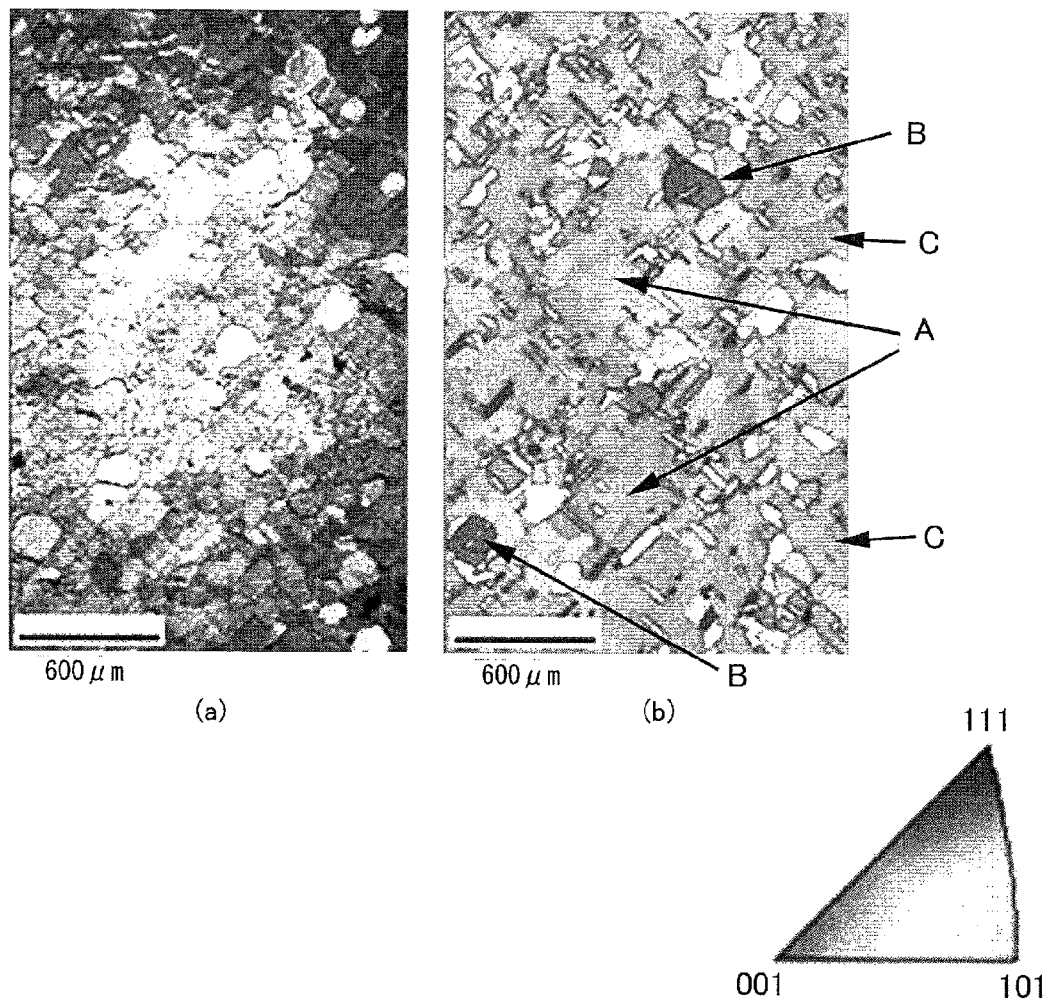
FIG. 3 An EBSD image of a rolled surface of a copper foil heated at 1000° C. for 30 minutes in Comparative Example 4.

On the other hand, FIG. 3 shows an EBSD image of the rolled surface of the copper foil heated at 1000° C. for 30 minutes in Comparative Example 4. FIG. 3 (a) is an SEM image. FIG. 3 (b) is an EBSD image. In FIG. 3 (b), a middle part C shows a (101) orientation, "A" shows a (001) orientation, and "B" shows a (111) orientation. As shown in FIG. 3 (b), in Comparative Example 4, the (001) orientation and the (101) orientation occupy the majority.

As the EBSD (electron backscatter diffraction apparatus), JXA8500F manufactured by JEOL Ltd., was used and

TABLE 1

| | Composition (wt. %) | | Thickness | reduction ratio at final cold rolling | $I/I_0$ of (111) plane | Average crystal grain size | Number of inclusions | Mechanical properties | | Sheet resistance |
|---|---|---|---|---|---|---|---|---|---|---|
| | | | | | | | | Tensile strength (TS) | Elongation (El) | |
| | P | Fe | (μm) | (η) | | (μm) | (Number) | (N/mm2) | (%) | (Ω/sq) |
| Example 1 | 0.01 | 0.003 | 6 | 3.1 | 5.8 | ≥1000 | 3 | 486 | 2.1 | 340 |
| Example 2 | 0.01 | 0.003 | 20 | 4.3 | 3.3 | ≥1000 | 2 | 481 | 2.2 | 350 |
| Example 3 | 0.01 | 0.003 | 35 | 3.8 | 2.5 | ≥1000 | 2 | 489 | 2.6 | 380 |
| Example 4 | 0.03 | 0.004 | 20 | 4.3 | 30.1 | ≥1000 | 5 | 535 | 1.2 | 270 |
| Example 5 | 0.03 | 0.001 | 35 | 3.8 | 28.5 | ≥1000 | 5 | 532 | 1.7 | 260 |
| Example 6 | 0.03 | 0.002 | 50 | 3.4 | 22.6 | ≥1000 | 6 | 485 | 2.0 | 290 |
| Example 7 | 0.05 | 0.005 | 20 | 4.3 | 45.2 | ≥1000 | 10 | 556 | 1.8 | 310 |
| Example 8 | 0.05 | 0.002 | 35 | 3.8 | 32.1 | ≥1000 | 12 | 538 | 1.9 | 300 |
| Example 9 | 0.10 | 0.004 | 35 | 3.8 | 52.3 | ≥1000 | 24 | 617 | 1.8 | 320 |
| Example 10 | 0.10 | 0.004 | 50 | 3.4 | 44.6 | ≥1000 | 22 | 582 | 2.1 | 350 |
| Example 11 | 0.20 | 0.005 | 18 | 4.4 | 62.7 | ≥1000 | 53 | 630 | 1.9 | 370 |
| Example 12 | 0.20 | 0.005 | 35 | 2.7 | 50.4 | ≥1000 | 48 | 607 | 2.0 | 390 |
| Comparative Example 1 | 0.005 | 0.003 | 18 | 4.4 | 0.01 | 100 | 0 | 435 | 1.8 | 490 |
| Comparative Example 2 | 0.005 | 0.003 | 35 | 3.8 | 0.01 | 120 | 0 | 422 | 1.6 | 480 |
| Comparative Example 3 | OFC | | 18 | 3.3 | 0.01 | 70 | 0 | 405 | 1.7 | 550 |
| Comparative Example 4 | TPC | | 35 | 2.7 | 0.01 | 80 | 0 | 418 | 1.6 | 510 |
| Comparative Example 5 | 0.25 | 0.008 | Processing rate is decreased to be difficult to produce a foil having a thickness of 50 μm or less | | | | | | | |
| Comparative Example 6 | 0.05 | 0.003 | 12 | 4.8 | 1.82 | 50 | 2 | 642 | 1.1 | 530 |

As apparent from Table 1, in each Example where P: 0.01 to 0.21 wt %, Fe: 0.006 wt % or less, $2.0 \leq (I/I_0)$ and a sheet resistance of graphene was 400 Ω/sq0 or less.

On the other hand, in each of Comparative Examples 1 to 4 where P was less than 0.01 wt %, $2.0 > (I/I_0)$ and the sheet resistance of graphene exceeded 400 Ω/sq, which resulted in low quality graphene. In Comparative Examples 3 and 4, the composition included 0.001 wt % or less of P and 0.001 wt % or less of Fe.

In Comparative Example 5 where P exceeded 2.1 wt % and Fe exceeded 0.006 wt %, the ingot was segregated, and no copper foil could be produced.

In Comparative Example 6 where the reduction ratio η in the final cold rolling exceeded 4.5, $2.0 > (I/I_0)$ and the sheet resistance of graphene exceeded 400 Ω/sq, which resulted in low quality graphene.

In each Example, the tensile strength (TS) was 480 N/mm² or more. In Comparative Examples 1 to 4, the tensile strength was lowered less than 480 N/mm².

FIG. 2 shows an EBSD image of the rolled surface of the copper foil heated at 1000° C. for 30 minutes in Example 6. FIG. 2(a) is an SEM image by the SEM attached to the measured with an accelerating voltage of 20 kV, a current of $2 \times 10^{-8}$ A, a measurement range of 1700 μm×2690 μm, and a step width of 10 μm.

REFERENCE SIGNS LIST 10 copper foil for producing two-dimensional hexagonal lattice compound
20 graphene
30 transfer sheet

What is claimed is:

1. A rolled copper foil for producing a two-dimensional hexagonal lattice compound, including 0.01 to 0.21 wt % phosphorous (P) and 0.001 to 0.006 wt % iron (Fe), having a thickness of 5 to 50 μm, and having the following relationship: $2.0 \leq (I/I_0)$ where I is a (111) diffraction intensity determined by an X ray diffraction of a rolled surface after heating at 1000° C. for 30 minutes and $I_0$ is a (111) diffraction intensity determined by an X ray diffraction of fine powder copper.

2. The rolled copper foil for producing a two-dimensional hexagonal lattice compound according to claim 1, wherein the average crystal grain size is 1000 μm or more after heating at 1000° C. for 30 minutes measured with a cutting method.

3. The rolled copper foil for producing a two-dimensional hexagonal lattice compound according to claim 1, wherein when 0.003 mm² of a section area is observed, 1 to 60 inclusions each having a 0.1 μm or more of a circle conversion diameter are present.

4. The rolled copper foil for producing a two-dimensional hexagonal lattice compound according to claim 2, wherein when 0.015 mm² of a section area is observed, 1 to 60 inclusions each having a 0.1 μm or more of a circle conversion diameter are present.

5. The rolled copper foil for producing a two-dimensional hexagonal lattice compound according to claim 1, wherein the two-dimensional hexagonal lattice compound is one of graphene and boron nitride.

6. The rolled copper foil for producing a two-dimensional hexagonal lattice compound according to claim 2, wherein the two-dimensional hexagonal lattice compound is one of graphene and boron nitride.

7. The rolled copper foil for producing a two-dimensional hexagonal lattice compound according to claim 3, wherein the two-dimensional hexagonal lattice compound is one of graphene and boron nitride.

8. The rolled copper foil for producing a two-dimensional hexagonal lattice compound according to claim 1, further comprising 0.01 wt % or less in total of one or more of elements selected from the group consisting of Ni, Sn, Mg, Ti and Zr.

9. The rolled copper foil for producing a two-dimensional hexagonal lattice compound according to claim 2, further comprising 0.01 wt % or less in total of one or more of elements selected from the group consisting of Ni, Sn, Mg, Ti and Zr.

10. The rolled copper foil for producing a two-dimensional hexagonal lattice compound according to claim 3, further comprising 0.01 wt % or less in total of one or more of elements selected from the group consisting of Ni, Sn, Mg, Ti and Zr.

11. The rolled copper foil for producing a two-dimensional hexagonal lattice compound according to claim 5, further comprising 0.01 wt % or less in total of one or more of elements selected from the group consisting of Ni, Sn, Mg, Ti and Zr.

12. The rolled copper foil for producing a two-dimensional hexagonal lattice compound according to claim 1, which is produced by hot rolling an ingot, annealing and cold rolling repeatedly one time or more, recrystallization annealing, and finally cold rolling, wherein reduction ratio η in the final cold rolling is defined as $1.0 \leq \eta < 4.5$.

13. The rolled copper foil for producing a two-dimensional hexagonal lattice compound according to claim 2, which is produced by hot rolling an ingot, annealing and cold rolling repeatedly one time or more, recrystallization annealing, and finally cold rolling, wherein reduction ratio η in the final cold rolling is defined as $1.0 \leq \eta < 4.5$.

14. The rolled copper foil for producing a two-dimensional hexagonal lattice compound according to claim 3, which is produced by hot rolling an ingot, annealing and cold rolling repeatedly one time or more, recrystallization annealing, and finally cold rolling, wherein reduction ratio η in the final cold rolling is defined as $1.0 \leq \eta < 4.5$.

15. A method of producing a two-dimensional hexagonal lattice compound using the rolled copper foil for producing a two-dimensional hexagonal lattice compound according to claim 1, comprising the steps of:
 providing a raw material gas of the two-dimensional hexagonal lattice compound while placing the heated rolled copper foil for producing a two-dimensional hexagonal lattice compound in a predetermined chamber to form the two-dimensional hexagonal lattice compound on a surface of the rolled copper foil for producing a two-dimensional hexagonal lattice compound; and
 laminating a transfer sheet on the surface of the two-dimensional hexagonal lattice compound, and etching and removing the rolled copper foil for producing a two-dimensional hexagonal lattice compound while transferring the two-dimensional hexagonal lattice compound to the transfer sheet.

16. The rolled copper foil for producing a two-dimensional hexagonal lattice compound according to claim 1, wherein the foil comprises 0.001 to 0.005 wt % Fe.

* * * * *